United States Patent
Oie et al.

(10) Patent No.: US 11,613,720 B2
(45) Date of Patent: Mar. 28, 2023

(54) AQUEOUS COMPOSITION AND CLEANING METHOD USING SAME

(71) Applicant: MITSUBISHI GAS CHEMICAL COMPANY, INC., Chiyoda-ku (JP)

(72) Inventors: Toshiyuki Oie, Katsushika-ku (JP); Akinobu Horita, Katsushika-ku (JP); Takahiro Kikunaga, Katsushika-ku (JP); Kenji Yamada, Katsushika-ku (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 233 days.

(21) Appl. No.: 17/049,828

(22) PCT Filed: Apr. 25, 2019

(86) PCT No.: PCT/JP2019/017587
§ 371 (c)(1),
(2) Date: Oct. 22, 2020

(87) PCT Pub. No.: WO2019/208685
PCT Pub. Date: Oct. 31, 2019

(65) Prior Publication Data
US 2021/0047593 A1 Feb. 18, 2021

(30) Foreign Application Priority Data
Apr. 27, 2018 (JP) .............................. JP2018-086441

(51) Int. Cl.
*C11D 7/08* (2006.01)
*C11D 7/10* (2006.01)
(Continued)

(52) U.S. Cl.
CPC ................. *C11D 7/08* (2013.01); *C11D 7/10* (2013.01); *C11D 7/28* (2013.01); *C11D 7/36* (2013.01);
(Continued)

(58) Field of Classification Search
CPC .................................................. C11D 11/0047
(Continued)

(56) References Cited

U.S. PATENT DOCUMENTS

| | | |
|---|---|---|
| 2006/0040838 A1 | 2/2006 | Shimada et al. |
| 2009/0065735 A1 | 3/2009 | Kolics et al. |
| 2013/0296214 A1 | 11/2013 | Barnes et al. |

(Continued)

FOREIGN PATENT DOCUMENTS

| | | |
|---|---|---|
| JP | 2006-83376 A | 3/2006 |
| JP | 2013-533631 A | 8/2013 |

(Continued)

OTHER PUBLICATIONS

Padmanaban, M. et al., "Progress in Spin-on Hard Mask Materials for Advanced Lithography," Journal of Photopolymer Science and Technology, vol. 27, No. 4, 2014, pp. 503-509.
Bakke, T. et al., "Etch Stop Materials for Release by Vapor HF Etching," 16th MME Workshop, 2005, (total pp. 4).
(Continued)

Primary Examiner — Gregory E Webb
(74) Attorney, Agent, or Firm — Oblon, McClelland, Maier & Neustadt, L.L.P.

(57) ABSTRACT

An aqueous composition includes (A) from 0.001 to 20 mass % of one or more kinds of fluorine-containing compounds selected from tetrafluoroboric acid, hexafluorosilicic acid, hexafluoroaluminic acid, hexafluorotitanic acid and a salt thereof, with respect to the total amount of the aqueous composition; and (B) from 0.0001 to 10 mass % of one or
(Continued)

more kinds of compounds selected from a $C_{4-13}$ alkylphosphonic acid, a $C_{4-13}$ alkylphosphonate ester, a $C_{4-13}$ alkyl phosphate and a salt thereof, with respect to the total amount of the aqueous composition.

20 Claims, 2 Drawing Sheets

(51) Int. Cl.

| | | |
|---|---|---|
| *C11D 7/28* | (2006.01) | |
| *C11D 7/36* | (2006.01) | |
| *C11D 11/00* | (2006.01) | |
| *C11D 17/00* | (2006.01) | |
| *H01L 21/308* | (2006.01) | |

(52) U.S. Cl.
CPC ...... *C11D 11/0047* (2013.01); *C11D 17/0008* (2013.01); *H01L 21/308* (2013.01)

(58) Field of Classification Search
USPC .......................................................... 510/175
See application file for complete search history.

(56) References Cited

U.S. PATENT DOCUMENTS

| | | |
|---|---|---|
| 2015/0337245 A1 | 11/2015 | Hayama et al. |
| 2016/0130500 A1 | 5/2016 | Chen et al. |
| 2017/0200619 A1 | 7/2017 | Cooper et al. |
| 2019/0071623 A1 | 3/2019 | Kamimura et al. |
| 2019/0177670 A1 | 6/2019 | Kamimura |
| 2019/0300821 A1 | 10/2019 | Yoshizaki et al. |

FOREIGN PATENT DOCUMENTS

| | | | |
|---|---|---|---|
| JP | 2016-171294 A | 9/2016 | |
| JP | 2016-527707 A | 9/2016 | |
| JP | 2017-25326 A | 2/2017 | |
| JP | 2017-519862 A | 7/2017 | |
| WO | WO-2013138276 A1 * | 9/2013 | ............ C09K 13/06 |
| WO | WO 2017/208749 A1 | 12/2017 | |
| WO | WO 2018/061365 A1 | 4/2018 | |
| WO | WO 2018/061670 A1 | 4/2018 | |

OTHER PUBLICATIONS

International Search Report dated Jul. 2, 2019 in PCT/JP2019/017587 filed on Apr. 25, 2019, 2 pages.

* cited by examiner

AQUEOUS COMPOSITION AND CLEANING METHOD USING SAME

TECHNICAL FIELD

The present invention relates to an aqueous composition and a cleaning method using the same, for example, a cleaning composition used in a production process of an electronic device (for example, a semiconductor element) and a cleaning method using the same.

BACKGROUND ART

In a process of producing an electronic device such as a semiconductor element, a dry etching process is usually employed upon forming a semiconductor integrated circuit. During this dry etching process, dry etch residues (a zirconium-based residue, a titanium-based residue, a polymer residue, etc.) are generated, which need to be removed. It is preferable that a cleaning agent used for removing such dry etch residues does not adversely affect (for example, corrode) the metal line material (for example, copper, titanium, cobalt, tungsten, etc.) used in the semiconductor integrated circuit to be cleaned.

A variety of cleaning agents have been developed from these points of view. For example, cleaning compositions for removing dry etch residues remaining after dry etching, cleaning methods using the same, and the like are disclosed in Japanese Unexamined Patent Application Publication (translation of PCT) No. 2013-533631 (Patent document 1), Japanese Unexamined Patent Application Publication No. 2016-171294 (Patent document 2), Japanese Unexamined Patent Application Publication No. 2006-83376 (Patent document 3) and else.

A hardmask is sometimes used during the process of forming a semiconductor integrated circuit. While silicon- and titanium-based materials have been conventionally employed as the materials of such hardmasks, zirconia-based hardmasks have recently been proposed as well (Non-patent document 1: M Padmanaban et al, J. Photopolym. Sci. Technol., 27 (2014) 503).

Furthermore, when dry etching is employed for via formation, fluorine-based gas is selected. Since alumina is highly resistant against fluorine-based gas and thus can serve as an etch stop layer even in a form of a thin film, alumina is advantageously selected as an etch stop layer. Thus, alumina-based etch stop layers are recently proposed (Non-patent document 2: 16th MME workshop, Goeteborg, Sweden, 2005 "Etch stop materials for release by vapor HF etching").

PRIOR ART DOCUMENTS

Patent Documents

Patent document 1: Japanese Unexamined Patent Application Publication (translation of PCT) No. 2013-533631
Patent document 2: Japanese Unexamined Patent Application Publication No. 2016-171294
Patent document 3: Japanese Unexamined Patent Application Publication No. 2006-83376

Non-Patent Documents

Non-patent document 1: M Padmanaban et al, J. Photopolym. Sci. Technol., 27 (2014), 503

Non-patent document 2: 16th MME workshop, Goeteborg, Sweden, 2005, "Etch stop materials for release by vapor HF etching"

SUMMARY OF INVENTION

Problem to be Solved by the Invention

Since various metal line materials may be used in an electronic devices and various masking materials may be used upon dry etching, and combinations thereof can vary, there is a need for development of a novel cleaning composition in view of efficiently removing dry etch residues, effectively preventing corrosion of metal line materials and else.

Means for Solving the Problem the present invention provides an aqueous composition, a cleaning method using the same and the like below.

[1] An aqueous composition comprising:
(A) 0.001-20 mass % of one or more kinds of fluorine-containing compounds selected from tetrafluoroboric acid, hexafluorosilicic acid, hexafluoroaluminic acid, hexafluorotitanic acid and a salt thereof, with respect to the total amount of the composition; and
(B) 0.0001-10 mass % of one or more kinds of compounds selected from a $C_{4-13}$ alkylphosphonic acid, a $C_{4-13}$ alkylphosphonate ester, a $C_{4-13}$ alkyl phosphate and a salt thereof, with respect to the total amount of the composition.

[2] The composition according to [1] above, wherein pH is in a range of 0-7 (for example, 0-6, 0-5, 0-4 or 0-3).

[3] The composition according to either one of [1] and [2] above, further comprising hydrogen fluoride (HF).

[4] The composition according to [3] above, wherein Component (A) is hexafluorosilicic acid or a salt thereof (for example, an ammonium salt).

[5] The composition according to any one of [1]-[4] above, wherein the aqueous composition comprises at least one selected from:
n-butylphosphonic acid, n-pentylphosphonic acid, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, n-tridecylphosphonic acid or a mixture thereof, as the alkylphosphonic acid;
n-butylphosphonate ester, n-pentylphosphonate ester, n-hexylphosphonate ester, n-heptylphosphonate ester, n-octylphosphonate ester, n-nonylphosphonate ester, n-decylphosphonate ester, n-undecylphosphonate ester, n-dodecylphosphonate ester, n-tridecylphosphonate ester or a mixture thereof, as the alkylphosphonate ester; and
salts of said alkylphosphonic acid or said alkylphosphonate ester.

[5a] The composition according to any one of [1]-[5] above, wherein the alkylphosphonic acid is a $C_{4-13}$ alkylphosphonic acid (preferably a $C_{5-11}$ alkylphosphonic acid, more preferably a $C_{5-9}$ alkylphosphonic acid, and still more preferably a $C_{6-8}$ alkylphosphonic acid).

[6] The composition according to any one of [1]-[4] above, wherein the aqueous composition comprises at least one selected from:
n-butyl phosphate, n-pentyl phosphate, n-hexyl phosphate, n-heptyl phosphate, n-octyl phosphate, n-nonyl phosphate, n-decyl phosphate, n-undecyl phosphate, n-dodecyl phosphate, n-tridecyl phosphate, 2-ethylhexyl phosphate, isodecyl phosphate or a mixture thereof, as the alkyl phosphate; and salts of said alkyl phosphate.

[6a] The composition according to any one of [1]-[6] above, wherein the alkyl phosphate is a $C_{4-13}$ alkyl phosphate (preferably a $C_{5-11}$ alkyl phosphate, more preferably a $C_{5-9}$ alkyl phosphate, and still more preferably a $C_{6-8}$ alkyl phosphate).

[6b] The composition according to any one of [1]-[6a] above, which is a dry etch residue removing composition used for removing a residue remaining after dry etching (for example, a zirconia-based dry etch residue).

[6c] The composition according to any one of [1]-[6b] above, which is a composition for preventing corrosion of a line material (for example, cobalt, a cobalt alloy or the like) of an electronic device targeted for cleaning.

[6d] The composition according to any one of [1]-[6c] above, wherein dodecylphosphonic acid is excluded from the alkylphosphonic acid.

[7] The composition according to any one of [1]-[6] above, wherein the number of alkyl chains in the alkylphosphonic acid, the alkylphosphonate ester and the alkyl phosphate is 2 or less.

[8] The composition according to any one of [1]-[7] above, wherein the number of alkyl chain in the alkylphosphonic acid, the alkylphosphonate ester and the alkyl phosphate is 1.

[9] A method for cleaning an electronic device, the method comprising the step of bringing the composition according to any one of [1]-[8] above into contact with the electronic device.

[10] A method for producing an electronic device, the method comprising the step of bringing the composition according to any one of [1]-[8] above into contact with the electronic device.

[11] An etching solution comprising the composition according to any one of [1]-[8] above.

[12] A cleaning solution comprising the composition according to any one of [1]-[8] above.

Advantageous Effect of the Invention

An aqueous composition in a preferred aspect of the present invention is capable of efficiently removing dry etch residues (for example, a zirconium-based dry etch residue, a titanium-based dry etch residue, a polymer-based dry etch residue, etc.) while preventing corrosion of a metal line material such as cobalt or a cobalt alloy, silicon nitride, an interlayer insulating film and the like.

Since a cleaning method in a preferred aspect of the present invention has a favorable effect of preventing corrosion of a line material such as cobalt or a cobalt alloy, silicon nitride, an interlayer insulating film and the like, and has a favorable effect of removing dry etch residues, it allows production of a high precision, high quality electronic device such as a semiconductor element at high yield in a production process of said electronic device.

EMBODIMENTS FOR CARRYING OUT THE INVENTION

Figure 1:
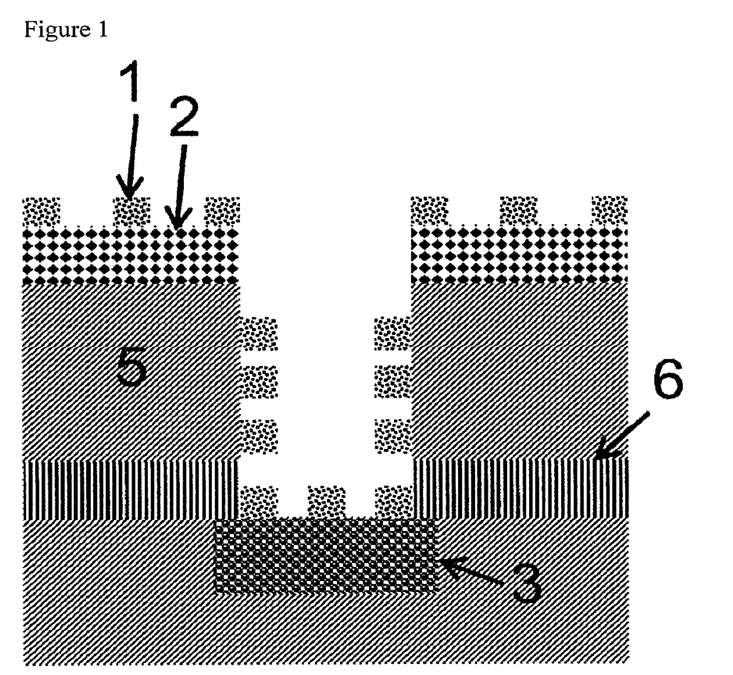
FIG. 1 A cross-sectional schematic view of a semiconductor element of one embodiment before removing dry etch residue 1, the element comprising a structure including a zirconia-based hardmask 2, cobalt or a cobalt alloy 3, a low dielectric interlayer insulating film 5 and silicon nitride 6.
Figure 2:
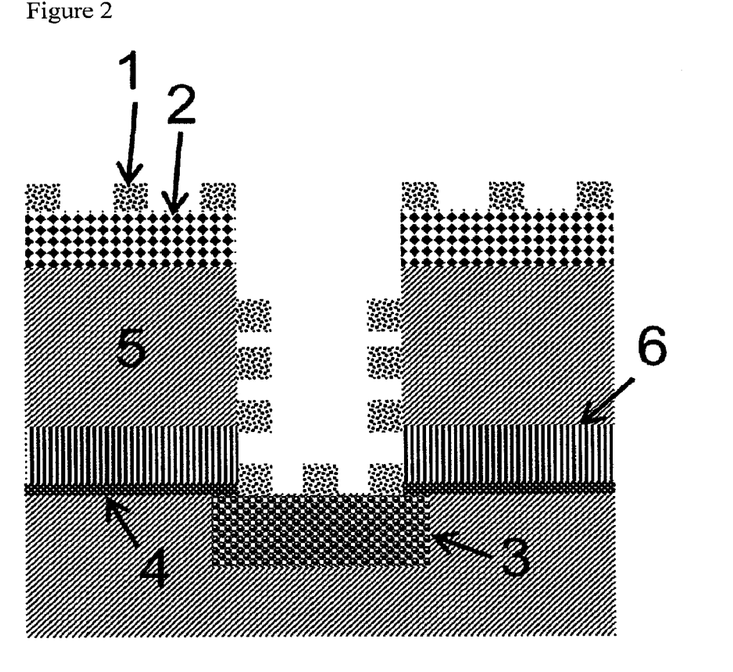
FIG. 2 A cross-sectional schematic view of a semiconductor element of one embodiment before removing dry etch residue 1, the element comprising cobalt or a cobalt alloy at the bottom of the via and a structure including a zirconia-based hardmask 2, cobalt or a cobalt alloy 3, alumina 4, a low dielectric interlayer insulating film 5 and silicon nitride 6.
Figure 3:
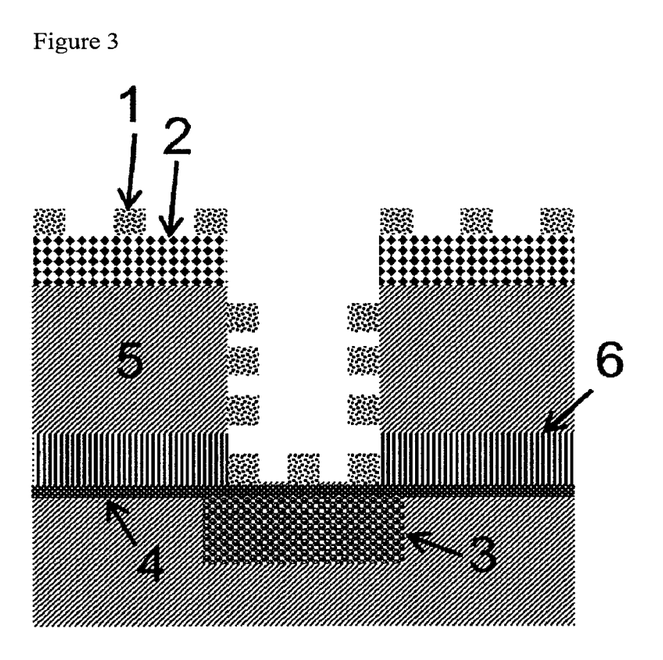
FIG. 3 A cross-sectional schematic view of a semiconductor element of one embodiment before removing dry etch residue 1, the element comprising alumina at the bottom of the via and a structure including a zirconia-based hardmask 2, cobalt or a cobalt alloy 3, alumina 4, a low dielectric interlayer insulating film 5 and silicon nitride 6.

An aqueous composition of the present invention comprises:

(A) 0.001-20 mass % of one or more kinds of fluorine-containing compounds selected from tetrafluoroboric acid, hexafluorosilicic acid, hexafluoroaluminic acid, hexafluorotitanic acid and a salt thereof, with respect to the total amount of the composition; and (B) 0.0001-10 mass % of one or more kinds of compounds selected from a $C_{4-13}$ alkylphosphonic acid, a $C_{4-13}$ alkylphosphonate ester, a $C_{4-13}$ alkyl phosphate and a salt thereof, with respect to the total amount of the composition.

Herein, ranges indicating the contents of respective components are inclusive of the upper and lower values. For example, the above-mentioned range of the content of Component (A) is inclusive of 0.001 mass % and 20 mass %.

Hereinafter, an aqueous composition of the present invention will be described in detail.

[Component (A): Fluorine-Containing Compound]

A fluorine-containing compound used in the present invention is selected from tetrafluoroboric acid, hexafluorosilicic acid, hexafluoroaluminic acid, hexafluorotitanic acid and a salt thereof. Examples of salts of these compounds include an ammonium salt, a tetramethylammonium salt, a tetraethylammonium salt, a tetrapropylammonium salt, a tetrabutylammonium salt, a lithium salt, a sodium salt, a potassium salt, a rubidium salt, a cesium salt, a beryllium salt, a magnesium salt, a strontium salt, a barium salt and the like. Among these compounds, hexafluorosilicic acid or a salt thereof (for example, an ammonium salt) is particularly preferable.

The amount of the fluorine-containing compound contained in the composition is 0.001-20 mass %, preferably 0.005-10 mass %, more preferably 0.01-5 mass % and particularly preferably 0.03-2 mass % with respect to the total amount of the composition.

According to the present invention, hydrogen fluoride, ammonium fluoride or the like can also be added as appropriate in addition to the above-mentioned fluorine-containing compounds. While the amount to be added can suitably be determined considering the amounts of other components added, it is, for example, 0.001-10 mass %, preferably 0.005-1 mass % and more preferably 0.01-0.1 mass % with respect to the total amount of the composition.

[(B) Alkylphosphonic Acids, Alkyl Phosphates, Salts Thereof and the Like]

(B1) Alkylphosphonic Acids, Alkylphosphonate Esters and Salts Thereof

An alkylphosphonic acid used in the present invention is a $C_{4-13}$ alkylphosphonic acid having 4-13 carbon atoms (an alkylphosphonic acid having 4-13 carbon atoms). Such alkylphosphonic acids are known and commercially available (for example, available from Tokyo Chemical Industry Co., Ltd.). The alkylphosphonic acid is preferably a $C_{5\text{-}11}$ alkylphosphonic acid, more preferably a $C_{5\text{-}9}$ alkylphosphonic acid, and still more preferably a $C_{6\text{-}8}$ alkylphosphonic acid. While the alkyl moiety of the alkylphosphonic acid may be either linear or branched, it is preferably linear. If the alkyl moiety of the alkylphosphonic acid is branched, the number of the branched chains is preferably 5 or less, more preferably 3 or less, and particularly preferably 1.

In the aqueous composition, an ester of the above-described alkylphosphonic acid may also be used. Specifically, an alkyl ester of the above-described $C_{4\text{-}13}$ alkylphosphonic acid (an alkylphosphonic acid having 4-13 carbon atoms) may also be used.

Where an alkylphosphonic acid can usually be represented by general formula $R_1P(=O)(OH)_2$ (wherein, $R_1$ is an alkyl group), an alkylphosphonate ester represented by general formula $R_1P(=O)(OR_2)_2$ (wherein, $R_1$ is an alkyl group, and $R_2$ is an alkyl group or hydrogen: provided that at least one of the two $R_2$ is an alkyl group) can also be used in the aqueous composition.

Moreover, an alkylphosphonate ester as described herein also comprises an alkyl ester of a phosphonic acid (phosphonate ester). Specifically, a phosphonate ester represented by general formula $R_1P(=O)(OR_2)_2$ (wherein, $R_1$ is hydrogen, $R_2$ is an alkyl group or a hydrogen atom: provided that at least one of the two $R_2$ is an alkyl group) can also be used herein as the alkylphosphonate ester in the aqueous composition.

As can be appreciated from above, a compound represented by General formula (A) below is used as the alkylphosphonic acid or the alkylphosphonate ester in the aqueous composition.

$$R_1P(=O)(OR_2)_2 \quad (A)$$

(in General formula (A), $R_1$ and $R_2$ are each independently an alkyl group or a hydrogen atom: provided that at least one among $R_1$ and the two $R_2$ is an alkyl group).

The alkylphosphonate ester used in the present invention is a $C_{4\text{-}13}$ alkylphosphonate ester having a total of 4-13 carbon atoms (an alkylphosphonate ester having a total of 4-13 carbon atoms). The alkylphosphonate ester is preferably a $C_{5\text{-}11}$ alkylphosphonate ester, more preferably a $C_{5\text{-}9}$ alkylphosphonate ester and still more preferably a $C_{6\text{-}8}$ alkylphosphonate ester. Furthermore, the alkyl chains of $R_1$ and $R_2$ in General formula (A) above each independently have carbon atoms of preferably 4-12, more preferably 6-11 and still more preferably 8-10.

While the alkyl groups of the alkylphosphonate ester, namely, $R_1$ and $R_2$ in the general formula above, may be either linear or branched, they preferably contain linear alkyl groups.

In addition, the number of alkyl chains in General formula (A) above, namely, the total number of the alkyl chains of $R_1$ and $R_2$, is preferably 2 or less. Specifically, while an alkylphosphonate ester in which both of $R_1$ and $R_2$ in General formula (A) $R_1P(=O)(OR_2)_2$ above are alkyl groups can be used, an alkylphosphonate ester in which $R_1$ is an alkyl group while one or none of $R_2$ is an alkyl group, an alkylphosphonate ester in which $R_1$ is hydrogen while two or less of $R_2$ is an alkyl group, or the like may be used. Still more preferably, an alkylphosphonic acid having only a single alkyl chain, that is, only one among $R_1$ and the two $R_2$ of General formula (A) $R_1P(=O)(OR_2)_2$ above is an alkyl group, is used. Particularly preferably, an alkylphosphonate ester in which only $R_1$ in General formula (A) above is an alkyl group is used.

The salt of the alkylphosphonic acid used in the present invention is a salt of the above-described alkylphosphonic acid, which is, for example, an ammonium salt, a tetramethylammonium salt, a tetraethylammonium salt, a tetrapropylammonium salt, a tetrabutylammonium salt, a lithium salt, a sodium salt, a potassium salt, a rubidium salt, a cesium salt, a beryllium salt, a magnesium salt, a calcium salt, a strontium salt, a barium salt or the like.

Examples of the alkylphosphonic acid or a salt thereof used in the present invention include n-butylphosphonic acid, n-pentylphosphonic acid, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, n-tridecylphosphonic acid, a salt thereof or a mixture thereof.

More preferable examples of the alkylphosphonic acid or a salt thereof that can be used include n-pentylphosphonic acid, n-hexylphosphonic acid, n-heptylphosphonic acid, n-octylphosphonic acid, n-nonylphosphonic acid, n-decylphosphonic acid, n-undecylphosphonic acid, a salt thereof and a mixture thereof.

In addition, a salt of the above-described alkylphosphonate ester can also be used in the aqueous composition. Examples of the salt of the alkylphosphonate ester include those corresponding to salts of the above-described alkylphosphonic acids.

The concentration of the alkylphosphonic acid, the alkylphosphonate ester or the salt thereof in the aqueous composition can suitably be changed by considering the kind of the line material of the electronic device targeted for etching or cleaning and the kind of the masking material used in the etching step. The concentration of the alkylphosphonic acid, the alkylphosphonate ester or the salt thereof is preferably 0.0002-2 mass %, more preferably 0.0003-0.5 mass % and particularly preferably 0.0003-0.1 mass % with respect to the total amount of the composition.

(B2) Alkyl Phosphates and Salts Thereof

An alkyl phosphate used in the present invention is a $C_{4\text{-}13}$ alkyl phosphate having 4-13 carbon atoms (an alkyl phosphate having 4-13 carbon atoms). Such alkyl phosphates are known and commercially available (for example, available from Tokyo Chemical Industry Co., Ltd.). The alkyl phosphate is preferably a $C_{5\text{-}11}$ alkyl phosphate, more preferably a $C_{5\text{-}9}$ alkyl phosphate, and still more preferably a $C_{6\text{-}8}$ alkyl phosphate. While the alkyl moiety of the alkyl phosphate may be either linear or branched, it is preferably linear. In a branched alkyl moiety of the alkyl phosphate, the number of the branched chains is preferably 5 or less, more preferably 3 or less, and particularly preferably 1.

Other than a monoalkyl ester of phosphoric acid, a dialkyl ester or a trialkyl ester of phosphoric acid may also be used as the alkyl phosphate in the aqueous composition of the present invention. Specifically, not only a monoalkyl ester of phosphoric acid represented by General formula $P(=O)(OR_3)_3$ (wherein, all of $R_3$ are hydrogen atoms) in which only one of $R_3$ is substituted with an alkyl group, but also a dialkyl ester in which two of $R_3$ are substituted with alkyl groups and a trialkyl ester in which all of $R_3$ are substituted with alkyl groups can be used in the aqueous composition of the present invention. However, the alkyl phosphate is preferably a dialkyl ester in which the number of alkyl chains is two or less (i.e., two of $R_3$ in General formula $P(=O)(OR_3)_3$ above are alkyl groups) or a monoalkyl ester (i.e., only one of $R_3$ in General formula $P(=O)(OR_3)_3$ above is an alkyl group), and more preferably a monoalkyl ester in which the number of the alkyl chain is 1. Specifically, the alkyl phosphate preferably has a single alkyl chain (an alkyl group represented by $R_3$ above).

Regardless of the number of ester bonds, the alkyl phosphate has a total of 4-13 carbon atoms. Regardless of the number of ester bonds, the alkyl phosphate is preferably a $C_{5-11}$ alkyl phosphate ester, more preferably a $C_{5-9}$ alkyl phosphate ester and still more preferably a $C_{6-8}$ alkyl phosphate ester.

Furthermore, the alkyl chain of $R_3$ in General formula $P(=O)(OR_3)_3$ above has carbon atoms of preferably 4-12, more preferably 6-11 and still more preferably 8-10. While the alkyl groups of the alkyl phosphate, namely, $R_3$ in General formula $P(=O)(OR_3)_3$ above, may be either linear or branched, they are preferably linear.

The salt of the alkyl phosphate used in the present invention is a salt of the above-described monoalkyl ester or dialkyl ester of phosphoric acid, which is, for example, an ammonium salt, a tetramethylammonium salt, a tetraethylammonium salt, a tetrapropylammonium salt, a tetrabutylammonium salt, a lithium salt, a sodium salt, a potassium salt, a rubidium salt, a cesium salt, a beryllium salt, a magnesium salt, a calcium salt, a strontium salt, a barium salt or the like.

Examples of the alkyl phosphate or a salt thereof used in the present invention include n-butyl phosphate, n-pentyl phosphate, n-hexyl phosphate, n-heptyl phosphate, n-octyl phosphate, n-nonyl phosphate, n-decyl phosphate, n-undecyl phosphate, n-dodecyl phosphate, n-tridecyl phosphate, 2-ethylhexyl phosphate, isodecyl phosphate, a salt thereof or a mixture thereof.

Examples of the alkyl phosphate or a salt thereof that can favorably be used include n-pentyl phosphate, n-hexyl phosphate, n-heptyl phosphate, n-octyl phosphate, n-nonyl phosphate, n-decyl phosphate, n-undecyl phosphate, 2-ethylhexyl phosphate, isodecyl phosphate, a salt thereof and a mixture thereof.

The concentration of the alkyl phosphate or a salt thereof in the aqueous composition can suitably be changed by considering the kind of the line material of the electronic device targeted for etching or cleaning and the kind of the masking material used in the etching step. The concentration of the alkyl phosphate or a salt thereof is in a range of preferably 0.0002-2 mass %, still more preferably 0.0003-0.5 mass % and particularly preferably 0.0003-0.1 mass % with respect to the total amount of the composition.

[Component (C): Water]

The composition of the present invention is aqueous and contains water as a diluent. While the water of the present invention is not particularly limited, it is preferably water that has been removed of metal ions, organic impurities, particles and the like by distillation, an ion exchange treatment, a filter treatment, any adsorption treatment or the like, and is particularly preferably pure water or ultrapure water.

The amount of water contained in the composition is usually 40-99.9999 mass % and preferably, 97.95-99.9697 mass %.

[Other Components]

The aqueous composition of the present invention may be added with an additive that is conventionally used in aqueous compositions for semiconductors as long as it does not interfere with the purpose of the present invention.

If necessary, the aqueous composition of the present invention may be added with an additive that is conventionally used in aqueous compositions for semiconductors as long as it does not interfere with the purpose of the present invention.

For example, an acid, alkali, a chelating agent, a surfactant, a defoamer, an oxidant, a reductant, an anti-corrosive agent for metals, a water-soluble organic solvent or the like may be added as additives. These additives are known and described, for example, in Japanese Unexamined Patent Application Publication (translation of PCT) No. 2013-533631.

[Method for Preparing Aqueous Composition (Liquid Composition)]

The aqueous composition (liquid composition) of the present invention can be prepared by agitating the above-described Component (A), the above-described Component (B), water and the above-described other components, until homogeneous.

While the range of the pH of the aqueous composition is not particularly limited, it is usually 0-7, preferably 0-6, more preferably 0-5 and still more preferably 0-4.

An aqueous composition in a preferred aspect of the present invention is capable of efficiently removing dry etch residues (for example, a zirconium-based dry etch residue, a titanium-based dry etch residue, a polymer-based dry etch residue, etc.) while preventing corrosion of a metal line material such as cobalt or a cobalt alloy, silicon nitride, an interlayer insulating film and the like.

[Method of Using Aqueous Composition: Method for Cleaning/Producing Electronic Device]

When used as an aqueous composition for cleaning (hereinafter, also referred to as a "cleaning solution"), an aqueous composition of the present invention can remove dry etch residues by making contact with an electronic device (for example, a semiconductor element) in a wet etching step (or in a step prior to or following said step). For example, a cleaning solution may be placed in a cleaning container so that an electronic device targeted for cleaning can be immersed in the cleaning solution to remove the dry etch residues, thereby cleaning the electronic device. Alternatively, an electronic device can be subjected to a treatment in a single-wafer cleaning mode to remove the dry etch residues, thereby cleaning the electronic device. Besides a dry etch residue removing solution (a cleaning solution), the aqueous cleaning composition can also favorably be used as an etching solution. In addition, the aqueous composition can also be used as a cleaning solution for cleaning the electronic device after a step of chemical-mechanical polishing (CMP).

Hence, an aqueous composition of the present invention may favorably be used in a cleaning method that comprises a step of cleaning an electronic device, and a method for producing an electronic device comprising such step.

The temperature of the cleaning solution of the present invention upon use is usually 10-80° C., preferably 15-70° C., more preferably 20° C.-65° C. and particularly preferably 20° C.-60° C. The temperature may suitably be selected according to the conditions of cleaning and the electronic device used (for example, a semiconductor element).

The cleaning solution of the present invention is usually used for 0.2-60 minutes. The time may suitably be selected according to the conditions of cleaning and the electronic device used (for example, a semiconductor element). A rinse solution used following the cleaning solution of the present invention may be an organic solvent, water, carbonated water or ammonia water.

[Electronic Devices Targeted for Cleaning/Production]

An electronic device targeted for cleaning and production employing the present invention is, for example, a semiconductor element or a display element, where a target for cleaning is usually an intermediate product that is obtained after a dry etching process. A semiconductor element or a display element is a substrate material such as silicon, amorphous silicon, polysilicon or glass, an insulating material such as silicon oxide, silicon nitride, silicon carbide or a derivative thereof, a material such as cobalt, a cobalt alloy, tungsten or titanium-tungsten, a compound semiconductor such as gallium-arsenic, gallium-phosphorus, indium-phosphorus, indium-gallium-arsenic or indium-aluminum-arsenic, or an oxide semiconductor such as chromium oxide. The electronic device targeted for cleaning by the present invention is particularly preferably an element using a cobalt or cobalt alloy line material, a zirconia-based hardmask, silicon nitride (SiN) and a low dielectric interlayer insulating film (for example, a tetraethoxysilicate film).

Dry etch residues targeted by the present invention are, for example, those that are generated upon forming a via or trench structure in a low dielectric interlayer insulating film by dry etching using a zirconia-based hardmask as a mask. Some of the dry etch residues are generated when etching gas makes contact with the zirconia-based hardmask. In this case, naturally, the targeted dry etch residue contains zirconium.

EXAMPLES

Hereinafter, the present invention will be described specifically by means of examples. The embodiments, however, can suitably be modified as long as the advantage of the present invention is attained.

Unless otherwise specified, "%" refers to "mass %".

[Wafer Used for Evaluation]

<Evaluation Wafer A>: Wafer for Evaluating Removal of Dry Etch Residue

Silicon nitride, an interlayer insulating film, silicon nitride, zirconia and a photoresist were sequentially formed from the bottom into a film, and then a photoresist was patterned thereon.

The predetermined part of the hardmask was removed by dry etching using the photoresist as a mask, and the photoresist was removed by oxygen plasma ashing. Furthermore, a via was formed in the silicon nitride and the interlayer insulating film by dry etching using the hardmask as a mask.

<Filmed Wafer>: Wafer for Evaluating Damage to Silicon Nitride, Low Dielectric Interlayer Insulating Film and Cobalt Wafers on which materials (silicon nitride, low dielectric interlayer insulating film and cobalt) were formed to give respective films were used. TEOS (tetraethoxysilicate), i.e., one kind of low dielectric interlayer insulating film, was applied as the low dielectric interlayer insulating film.

These films were formed as follows.

(1) Silicon nitride (SiN): formed into a film to a thickness of 1000 Å on Si by plasma-enhanced chemical vapor deposition.

(2) TEOS: formed into a film to a thickness of 1000 Å on Si by chemical vapor deposition.

(3) Cobalt: formed into a film to a thickness of 2000 Å on Si by physical vapor deposition.

[Evaluation Method]

<Removal of Dry Etch Residues>

Evaluation wafers A that were treated with various aqueous compositions (cleaning solutions) were observed by SEM.

Instrument used for measurement; Ultra-high resolution field emission scanning electron microscope SU9000 (100,000× magnification) available from Hitachi High-Tech Corporation Evaluation criteria:

E: Dry etch residue was completely removed.

G: Dry etch residue was almost completely removed.

N: Removal of dry etch residue was slightly insufficient.

P: Removal of dry etch residue was insufficient.

Evaluations E and G were found to be acceptable.

<Film Thickness>

The film thicknesses of the filmed wafers were measured using a x-ray fluorescence spectrometer SEA1200VX available from SII NanoTechnology (Film thickness measuring instrument A) or an optical film thickness gauge n&k 1280 available from n&k technology, Inc (Film thickness measuring instrument B). The film thickness of the cobalt-filmed wafer was measured using Film thickness measuring instrument A while the film thicknesses of the silicon nitride- and TEOS-filmed wafers were measured using Film thickness measuring instrument B.

<E.R. (Etch Rate)>

Each of the filmed wafers was treated with a cleaning solution, and the difference in the film thicknesses before and after the treatment was divided by the treatment time to determine E.R.

E.R. of 2 Å/min or less for silicon nitride, E.R. of 5 Å/min or less for TEOS and E.R. of 5 Å/min or less for cobalt were found to be acceptable.

<Measurement of pH Value>

The pH value of the aqueous composition in each of the examples and the comparative examples was measured at 25° C. using a pH meter (pH meter F-52 available from Horiba, Ltd.).

Examples 1-14 and Reference Examples 1-11

Evaluation wafer A and the silicon nitride-, TEOS- and cobalt-filmed wafers were used for the test. The wafers were immersed in the aqueous compositions (cleaning solutions) indicated in Table 1 at the treatment temperature indicated in Table 1, and subsequently rinsed with ultrapure water and dried by dry nitrogen gas blowing.

Evaluation wafers A were all subjected to the immersion treatment for 3 minutes, and the treated wafers were observed by SEM.

The silicon nitride-, TEOS- and cobalt-filmed wafers were each subjected to the immersion treatment for 30 minutes. E.R. was calculated from the film thicknesses before and after the treatment.

In Examples 1-14, the dry etch residues were found to be removed completely while preventing damage to silicon nitride (SiN), TEOS and cobalt.

Meanwhile, in Comparative examples 1-11 shown in Table 2, there were cases where damage to cobalt was not suppressed, the dry etch residues were not removed, and the dry etch residues were not removed while preventing damage to silicon nitride and TEOS.

TABLE 1

| Example | Treatment temperature/ °C | Composition Fluorine-containing compound/mass % | | Alkylphosphonic acid or alkyl phosphate/mass % | |
|---|---|---|---|---|---|
| 1 | 20 | Tetrafluoroboric acid | 2 | Ammonium n-octylphosphonate | 0.001 |
| 2 | 20 | Hexafluorosilicic acid | 0.75 | N-octylphosphonic acid | 0.01 |
| 3 | 50 | Potassium hexafluoroaluminate | 1 | Ammonium n-octylphosphonate | 0.01 |
| 4 | 50 | Ammonium hexafluorotitanate | 0.5 | Ammonium n-octylphosphonate | 0.01 |
| 5 | 50 | Ammonium hexafluorosilicate | 2 | N-octylphosphonic acid | 0.01 |
| 6 | 20 | Hexafluorosilicic acid | 1.5 | Ammonium n-hexylphosphonate | 0.1 |
| 7 | 20 | Hexafluorosilicic acid | 1.5 | N-decylphosphonic acid | 0.001 |
| 8 | 20 | Hexafluorosilicic acid | 1.5 | Ammonium n-dodecyl phosphate | 0.0003 |
| 9 | 20 | Hexafluorosilicic acid | 1.5 | Ammonium n-dodecylphosphonate | 0.0003 |
| 10 | 50 | Hexafluorosilicic acid | 0.03 | Ammonium n-octylphosphonate | 0.001 |
| 11 | 20 | Ammonium hexafluorosilicate/HF | 2/0.02 | N-octylphosphonic acid | 0.01 |
| 12 | 20 | Ammonium hexafluorotitanate/HF | 0.56/0.02 | N-octylphosphonic acid | 0.01 |
| 13 | 20 | Hexafluorosilicic acid | 0.75 | 2-Ethylhexyl phosphate | 0.01 |
| 14 | 20 | Hexafluorosilicic acid | 0.75 | Isodecyl phosphate | 0.01 |

| Example | Composition Water (mass %) | pH | Evaluation Removal of dry etch residue | SiN E.R. (Å/min) | TEOS E.R. (Å/min) | Cobalt E.R. (Å/min) |
|---|---|---|---|---|---|---|
| 1 | 97.999 | 1.4 | E | 0.7 | 1.2 | 0.9 |
| 2 | 99.24 | 1.8 | G | 0.7 | 1.3 | 0.4 |
| 3 | 98.99 | 5.0 | G | 1.8 | 0.4 | 0.3 |
| 4 | 99.49 | 3.7 | E | 0.7 | 0.2 | 2.0 |
| 5 | 97.99 | 2.7 | E | 1.9 | 0.3 | 0.3 |
| 6 | 98.4 | 1.7 | E | 1.5 | 3.7 | 0.7 |
| 7 | 98.499 | 1.7 | E | 1.2 | 3.5 | 1.0 |
| 8 | 98.4997 | 1.7 | G | 1.0 | 3.9 | 4.9 |
| 9 | 98.4997 | 1.7 | G | 1.1 | 3.8 | 4.8 |
| 10 | 99.969 | 2.8 | E | 1.9 | 0.3 | 4.3 |
| 11 | 97.97 | 3.3 | E | 0.5 | 1.1 | 0.5 |
| 12 | 99.41 | 3.1 | E | 0.4 | 0.9 | 0.5 |
| 13 | 99.24 | 1.6 | — | — | — | 1.1 |
| 14 | 99.24 | 1.6 | — | — | — | 0.9 |

TABLE 2

| Reference example | Treatment temperature/ °C | Composition Fluorine-containing compound/mass % | | Alkylphosphonic acid or alkyl phosphate/mass % | | Water (mass %) | pH | Evaluation Removal of dry etch residue | SiN E.R. (Å/min) | TEOS E.R. (Å/min) | Cobalt E.R. (Å/min) |
|---|---|---|---|---|---|---|---|---|---|---|---|
| 1 | 20 | Tetrafluoroboric acid | 2 | | | 98 | 1.4 | E | 0.7 | 1.2 | 65.0 |
| 2 | 20 | Hexafluorosilicic acid | 0.75 | | | 99.25 | 1.8 | E | 0.7 | 1.2 | 43.0 |
| 3 | 20 | Hexafluorosilicic acid | 1.5 | | | 98.5 | 1.7 | E | 1.3 | 1.9 | 66.0 |
| 4 | 50 | Potassium hexafluoroaluminate | 1 | | | 99 | 4.7 | E | 1.6 | 0.4 | 47.0 |
| 5 | 50 | Ammonium hexafluorotitanate | 0.5 | | | 99.5 | 3.7 | E | 0.4 | 0.2 | 36.0 |
| 6 | 50 | Ammonium hexafluorosilicate | 2 | | | 98 | 3.5 | E | 1.7 | 0.3 | 39.0 |
| 7 | 20 | Hexafluorosilicic acid | 0.75 | N-propylphosphonic acid | 0.1 | 99.15 | 1.8 | E | 0.5 | 1.3 | 19.0 |
| 8 | 20 | Hexafluorosilicic acid | 0.75 | Ammonium n-tetradecylphosphonate | 0.01 | 99.24 | 1.8 | P | 0.4 | 1.3 | 11.0 |
| 9 | 50 | Potassium hexafluorophosphate | 2 | | | 98 | 4.5 | P | 0.1 | 0.3 | 6.0 |

TABLE 2-continued

| Reference example | Treatment temperature/ °C. | Composition | | | | | Evaluation | | | |
|---|---|---|---|---|---|---|---|---|---|---|
| | | Fluorine-containing compound/mass % | | Alkylphosphonic acid or alkyl phosphate/mass % | | Water (mass %) | pH | Removal of dry etch residue | SiN E.R. (Å/min) | TEOS E.R. (Å/min) | Cobalt E.R. (Å/min) |
| 10 | 20 | HF | 0.04 | Ammonium n-octylphosphonate | 0.01 | 99.95 | 2.9 | N | 2.2 | 2.2 | 0.9 |
| 11 | 20 | Ammonium fluoride | 20 | N-octylphosphonic acid | 0.01 | 79.99 | 7.4 | P | 0.8 | 22.0 | 0.1 |

INDUSTRIAL APPLICABILITY

The aqueous composition in a preferred aspect of the present invention is capable of efficiently removing dry etch residues while preventing corrosion of a metal line material such as cobalt or a cobalt alloy, silicon nitride, an interlayer insulating film and the like.

Since an etching solution, a cleaning solution and a cleaning method in a preferred aspect of the present invention have a favorable effect in preventing corrosion of a metal line material such as cobalt and a cobalt alloy, silicon nitride, an interlayer insulating film and the like and have a favorable effect in removing dry etch residues, they allow production of a high precision, high quality electronic device such as a semiconductor element at high yield in a production process of said electronic device.

DESCRIPTION OF REFERENCE NUMERALS

1 Zirconia-based dry etch residue
2 Zirconia-based hardmask
3 Cobalt or cobalt alloy
4 Alumina
5 Low dielectric interlayer insulating film
6 Silicon nitride (SiN)

The invention claimed is:

1. An aqueous composition, comprising:
   at least one fluorine-containing compound selected from the group consisting of tetrafluoroboric acid, hexafluorosilicic acid, hexafluoroaluminic acid, hexafluorotitanic acid and a salt thereof such that the at least one fluorine-containing compound is in a range of 0.001 to 20 mass % with respect to a total amount of the aqueous composition; and
   at least one selected from the group consisting of a $C_{4-13}$ alkylphosphonic acid, a $C_{4-13}$ alkylphosphonate ester, a $C_{4-13}$ alkyl phosphate and a salt thereof such that the at least one selected from the group consisting of a $C_{4-13}$ alkylphosphonic acid, a $C_{4-13}$ alkylphosphonate ester, a $C_{4-13}$ alkyl phosphate and a salt thereof is in a range of 0.0001 to 10 mass % with respect to the total amount of the aqueous composition,
   wherein the $C_{4-13}$ alkylphosphonic acid is present and comprises at least one selected from the group consisting of n-butylphosphonic acid, n-pentylphosphonic acid, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, and n-tridecylphosphonic acid, optionally in salt form thereof, and/or the $C_{4-13}$ alkylphosphonate ester is present and comprises at least one selected from the group consisting of n-butylphosphonate ester, n-pentylphosphonate ester, n-hexylphosphonate ester, n-heptylphosphonate ester, n-octylphosphonate ester, n-nonylphosphonate ester, n-decylphosphonate ester, n-undecylphosphonate ester, n-dodecylphosphonate ester, and n-tridecylphosphonate ester, optionally in salt form thereof.

2. The aqueous composition according to claim 1, wherein the aqueous composition has a pH in a range of from 0 to 7.

3. The aqueous composition according to claim 1, further comprising hydrogen fluoride.

4. The aqueous composition according to claim 3, wherein the at least one fluorine-containing compound is hexafluorosilicic acid or a salt thereof.

5. The aqueous composition according to claim 1, wherein the $C_{4-13}$ alkylphosphonic acid is present and comprises at least one selected from the group consisting of n-butylphosphonic acid, n-pentylphosphonic acid, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, and n-tridecylphosphonic acid, optionally in salt form thereof, and the $C_{4-13}$ alkylphosphonate ester is present and comprises at least one selected from the group consisting of n-butylphosphonate ester, n-pentylphosphonate ester, n-hexylphosphonate ester, n-heptylphosphonate ester, n-octylphosphonate ester, n-nonylphosphonate ester, n-decylphosphonate ester, n-undecylphosphonate ester, n-dodecylphosphonate ester, and n-tridecylphosphonate ester, optionally in salt form thereof.

6. The aqueous composition according to claim 1, wherein the $C_{4-13}$ alkyl phosphate is present and comprises at least one selected from the group consisting of n-butyl phosphate, n-pentyl phosphate, n-hexyl phosphate, n-heptyl phosphate, n-octyl phosphate, n-nonyl phosphate, n-decyl phosphate, n-undecyl phosphate, n-dodecyl phosphate, n-tridecyl phosphate, 2-ethylhexyl phosphate, and isodecyl phosphate, optionally in salt form thereof.

7. The aqueous composition according to claim 1, wherein the $C_{4-13}$ alkylphosphonic acid, the $C_{4-13}$ alkylphosphonate ester or the $C_{4-13}$ alkyl phosphate is present and comprises 2 or less alkyl chains.

8. The aqueous composition according to claim 1, wherein the $C_{4-13}$ alkylphosphonic acid, the $C_{4-13}$ alkylphosphonate ester or the $C_{4-13}$ alkyl phosphate is present and comprises a single alkyl chain.

9. A method for cleaning an electronic device, comprising:
   bringing the aqueous composition of claim 1 into contact with the electronic device.

10. A method for producing an electronic device, comprising:
    bringing the aqueous composition of claim 1 into contact with the electronic device.

11. An etching solution, comprising:
    the aqueous composition of claim 1.

12. A cleaning solution, comprising:
the aqueous composition of claim 1.

13. The aqueous composition according to claim 1, wherein the $C_{4-13}$ alkylphosphonic acid is present and comprises at least one selected from the group consisting of n-butylphosphonic acid, n-pentylphosphonic acid, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, and n-tridecylphosphonic acid, optionally in salt form thereof, or the $C_{4-13}$ alkylphosphonate ester is present and comprises at least one selected from the group consisting of n-butylphosphonate ester, n-pentylphosphonate ester, n-hexylphosphonate ester, n-heptylphosphonate ester, n-octylphosphonate ester, n-nonylphosphonate ester, n-decylphosphonate ester, n-undecylphosphonate ester, n-dodecylphosphonate ester, and n-tridecylphosphonate ester, optionally in salt form thereof.

14. The aqueous composition according to claim 2, further comprising hydrogen fluoride.

15. The aqueous composition according to claim 14, wherein the at least one fluorine-containing compound is hexafluorosilicic acid or a salt thereof.

16. The aqueous composition according to claim 2, wherein the $C_{4-13}$ alkylphosphonic acid is present and comprises at least one selected from the group consisting of n-butylphosphonic acid, n-pentylphosphonic acid, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, and n-tridecylphosphonic acid, optionally in salt form thereof, and the $C_{4-13}$ alkylphosphonate ester is present and comprises at least one selected from the group consisting of n-butylphosphonate ester, n-pentylphosphonate ester, n-hexylphosphonate ester, n-heptylphosphonate ester, n-octylphosphonate ester, n-nonylphosphonate ester, n-decylphosphonate ester, n-undecylphosphonate ester, n-dodecylphosphonate ester, and n-tridecylphosphonate ester, optionally in salt form thereof.

17. The aqueous composition according to claim 2, wherein the $C_{4-13}$ alkyl phosphate is present and comprises at least one selected from the group consisting of n-butyl phosphate, n-pentyl phosphate, n-hexyl phosphate, n-heptyl phosphate, n-octyl phosphate, n-nonyl phosphate, n-decyl phosphate, n-undecyl phosphate, n-dodecyl phosphate, n-tridecyl phosphate, 2-ethylhexyl phosphate, and isodecyl phosphate, optionally in salt form thereof.

18. The aqueous composition according to claim 2, wherein the $C_{4-13}$ alkylphosphonic acid, the $C_{4-13}$ alkylphosphonate ester or the $C_{4-13}$ alkyl phosphate is present and comprises 2 or less alkyl chains.

19. The aqueous composition according to claim 2, wherein the $C_{4-13}$ alkylphosphonic acid, the $C_{4-13}$ alkylphosphonate ester or the $C_{4-13}$ alkyl phosphate is present and comprises a single alkyl chain.

20. A method for cleaning an electronic device, comprising:
bringing the aqueous composition of claim 2 into contact with the electronic device.

* * * * *